(12) United States Patent
You et al.

(10) Patent No.: US 6,937,086 B1
(45) Date of Patent: *Aug. 30, 2005

(54) METHOD AND APPARATUS FOR OPERATING A FIELD-EFFECT TRANSISTOR (FET) PAIR

(75) Inventors: Budong You, Fremont, CA (US); Marco A. Zuniga, Fremont, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/796,405

(22) Filed: Mar. 8, 2004

Related U.S. Application Data

(63) Continuation-in-part of application No. 10/327,586, filed on Dec. 20, 2002, now Pat. No. 6,703,888, which is a continuation of application No. 10/172,484, filed on Jun. 13, 2002, now Pat. No. 6,529,056, which is a continuation of application No. 09/853,356, filed on May 11, 2001, now Pat. No. 6,433,614, which is a continuation of application No. 09/798,008, filed on Mar. 2, 2001, now abandoned.

(51) Int. Cl.[7] .......................................... H03K 17/687
(52) U.S. Cl. ...................................... 327/404; 327/427
(58) Field of Search ........................ 327/112, 170, 427, 327/431, 434–435, 437, 440, 389, 365, 378–379, 327/384, 386, 404

(56) References Cited

U.S. PATENT DOCUMENTS 6,747,505 B1 * 6/2004 Gergintschew ............. 327/404

* cited by examiner

*Primary Examiner*—My-Trang Nu Ton
(74) *Attorney, Agent, or Firm*—Fish & Richardson P.C.

(57) ABSTRACT

A power switch, and a method, for use with a power switch having a field-effect transistor (FET) including source, drain and gate terminals. The power switch includes a first field-effect transistor (FET) having a first drain coupled to the drain terminal, a first source coupled to the source terminal, and a first gate; and, a second FET having a second drain coupled to the drain terminal, a second source coupled to the source terminal, and a second gate. The second FET has a gate length ($L_G$) that is greater than or less than an $L_G$ of the first FET and has a length of a drain ($L_D$) that is greater than or less than an $L_D$ of the first FET. The power switch further includes a control circuit coupled to the gate terminal, the first gate, and the second gate.

41 Claims, 9 Drawing Sheets

METHOD AND APPARATUS FOR OPERATING A FIELD-EFFECT TRANSISTOR (FET) PAIR

CROSS-REFERENCE TO RELATED APPLICATIONS

This application is a continuation-in-part application of and claims priority under 35 U.S.C. §120 to commonly-owned, U.S. application Ser. No. 10/327,586, filed on Dec. 20, 2002, now U.S. Pat. No. 6,703,888, which is a continuation of U.S. application Ser. No. 10/172,484, filed on Jun. 13, 2002, now U.S. Pat. No. 6,529,056, which is a continuation of U.S. application Ser. No. 09/853,356, filed on May 11, 2001, now U.S. Pat. No. 6,433,614, which is a continuation of U.S. application Ser. No. 09/798,008, filed on Mar. 2, 2001, now abandoned, the entire contents of which are hereby incorporated by reference.

BACKGROUND

This disclosure relates to transistor switches, and more particularly to metal oxide semiconductor field-effect transistor (MOSFET) switches.

In power management ICs having a monolithically integrated MOSFET power train, the on-chip field-effect transistor (FET) not only accounts for most of the power dissipation, but also can consume a significant amount of silicon area, and very often is the major concern regarding the long-term reliability of the chip.

FIG. 1 shows a cross-sectional view of a conventional asymmetric high-voltage NMOS transistor, compatible with standard CMOS processes. Although implementations are described with reference to an asymmetrical NMOS device, other types of MOSFET devices are applicable.

An N+ source region 104 is formed within a P-type substrate 102. Also formed in P-type substrate 102 is an N-type deep drain (NDD) region 106 that includes an N+ drain implant 108, and an N-type lightly doped drain (LDD) implant 112. Also, formed upon P-type substrate 102 is a gate 114.

Two important dimensions in the device structure shown in FIG. 1 are the length $L_G$ of gate 114 and the length of the drain $L_D$ (e.g., the spacing between the N+ drain implant 108 and gate 114). Design rules for these two dimensions can be set to meet two specifications: punch-through breakdown voltage, and hot-carrier lifetime.

Quite often, the hot-carrier lifetime specification (also referred to as the reliability specification), instead of the punch-through breakdown voltage specification, determines the design rule which dictates the minimum allowed dimensions of $L_G$ and $L_D$. In other words, in the applications where hot-carrier degradation is not of concern, a more aggressive design rule can be used to design a transistor such as that shown in FIG. 1 with smaller dimensions of $L_G$ and $L_D$ while still meeting the same punch-through breakdown voltage specification. A FET structure with smaller dimensions of $L_G$ or $L_D$ is generally preferred because such smaller dimensions not only reduce the overall chip area, but may also reduce the on-resistance and the junction capacitance of the FET, thus improving overall system efficiency.

Hot-carrier injection (HCI) typically occurs at the overlapping period between the transitions of the gate voltage and drain voltage of the FET, with the injection peaking when the gate voltage is approximately one half of the drain voltage. As a result, the typical inverter application turns out to be a stressful operation for a FET in terms of hot-carrier degradation. HCI is discussed in greater detail in W. Weber, C. Werner and A. V. Schwerin, "Lifetimes and substrate current in static and dynamic hot-carrier degradation", IEDM 86, pp 390–393, 1986.

FIG. 2 shows a conceptual time t versus voltage v plot of voltage waveforms for a conventional N-FET during switching transitions of a typical inverter mode operation. During the turn-on transition, the drain voltage $V_D$ goes low and the gate voltage $V_G$ goes high. During the turn-off transition, $V_D$ goes high and $V_G$ goes low. The area between times $t_1$ and $t_2$ and $t_3$ and $t_4$ shows the transition period during which strong hot-carrier injection generally occurs. Hot-carrier degradation may result in threshold voltage shift and transconductance degradation of an N-FET. Due to hot-carrier degradation concerns, a conventional design of a FET switch typically involves trade-offs between electrical performance, such as on-resistance, and reliability performance, such as hot-carrier lifetime. In general, making a conventional device more resilient to hot-carrier degradation involves increasing one or both of $L_G$ and $L_D$, while improving electrical performance (and minimizing device area) involves minimizing $L_G$ and $L_D$.

SUMMARY

In general, in one aspect, the specification describes a power switch having source, drain and gate terminals. The power switch further includes a first field-effect transistor (FET) having a first drain coupled to the drain terminal, a first source coupled to the source terminal, and a first gate; and, a second FET having a second drain coupled to the drain terminal, a second source coupled to the source terminal, and a second gate. The second FET has a gate length ($L_G$) that is greater than or less than an $L_G$ of the first FET and has a length of a drain ($L_D$) that is greater than or less than an $L_D$ of the first FET. The power switch further includes a control circuit coupled to the gate terminal, the first gate, and the second gate.

Particular implementations can include one or more of the following features. The control circuit can be configured to turn on the second FET before turning on the first FET. The control circuit can be coupled to the drain terminal. The control circuit can be configured to impose a fixed delay between turning on the first and second FETs. The control circuit can be configured to delay turning on the first FET until the voltage between the drain and source terminals falls below a predetermined voltage. The control circuit can be configured to turn off the second FET after turning off the first FET. The control circuit can be configured to impose a fixed delay between turning off the first and second FETs. The first FET can be designed for electrical performance superior to that of the second FET. The first FET can be an n-type CMOS FET or an LDMOS transistor. The second FET can be designed for reliability performance superior to that of the first FET. The first and second FETs, or the first and second FETs and the control circuit, can be implemented as a single monolithic device. The second FET can have an $L_G$ greater than an $L_G$ of the first FET and an $L_D$ greater than an $L_D$ of the first FET.

The power switch can further include a current sensing circuit configured to disable the first FET when the load current at the drain terminal is below a predetermined threshold current. The current sensing circuit can be configured to switch the second FET when the first FET is disabled. The first FET can have an area less than the area of the second FET. The second FET can have an $L_G$ smaller than an $L_G$ of the first FET and an $L_D$ smaller than an $L_D$ of the first FET. $L_D$ can be a measurement that represents spacing between an N+ drain implant and a gate of a given FET. The second FET can be more resilient to hot-carrier degradation than the first FET. The second FET can have a wider safe operating area (SOA) than the first FET. The second FET can have a higher avalanche energy rating than the first FET.

In general, in another aspect, the specification describes a method of operating a power switch having a source terminal and a drain terminal. The method includes turning on a first field-effect transistor (FET) that has a first drain coupled to the drain terminal, a first source coupled to the source terminal, and a first gate; turning on a second FET while the first FET is on, the second FET having a second drain coupled to the drain terminal, a second source coupled to the source terminal, and a second gate, the second FET having a gate length ($L_G$) that is greater than or less than an $L_G$ of the first FET and having a length of a drain ($L_D$) that is greater than or less than an $L_D$ of the first FET; turning off the second FET while the first FET is on; and turning off the first FET.

Particular implementations can include one or more of the following features. Turning on and off the second FET and first FET can include directing signals from a control circuit to the first and second gates. The method can further include any of the following steps: receiving a signal in the control circuit from the drain terminal; delaying turning on the second FET for a predetermined period of time after turning on the first FET; determining a voltage between the drain and source terminals; delaying turning on the second FET until the voltage between the drain and source terminals falls below a predetermined voltage; delaying turning off the first FET for a predetermined period of time after turning off the second FET. The method can also further include any of the following steps: determining a load current at the drain terminal; disabling the second FET when the load current at the drain terminal is below a predetermined threshold current; and switching the first FET when the second FET is disabled.

Advantages that can be seen in implementations of the invention include one or more of the following. Implementations of the invention provide cost reduction, efficiency improvement and reliability enhancement in switching applications. A helper FET can only accounts for a small percentage of a total FET switch size, allowing designers to cut an overall area of a FET power switch while improving overall switching efficiency. Such an approach successfully overcomes the tradeoff between electrical performance and reliability performances of conventional power MOSFET switches.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
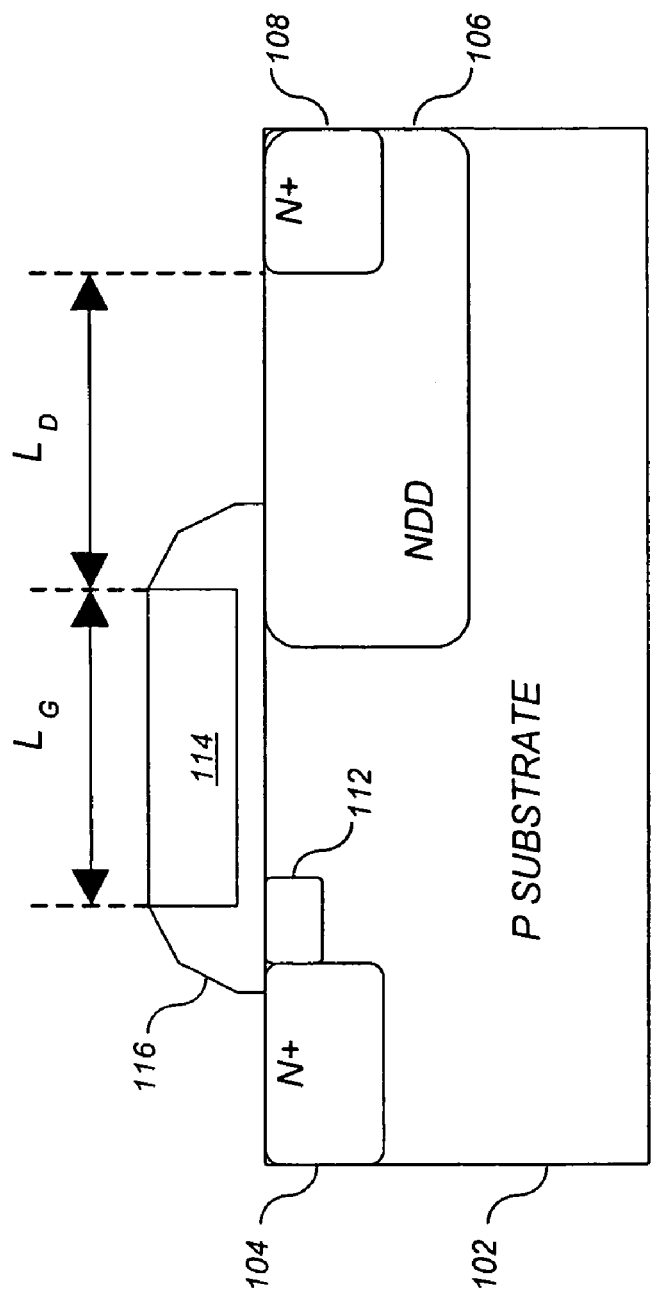
FIG. 1 shows a cross-sectional view of a conventional asymmetric high-voltage NMOS transistor.
Figure 2:
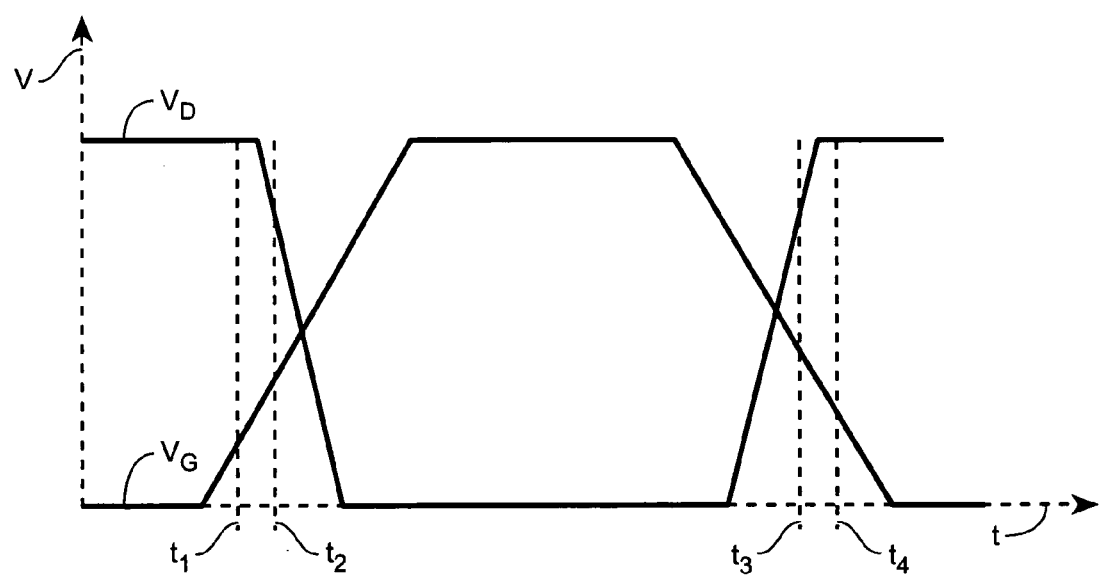
FIG. 2 is a time t versus voltage v plot of voltage waveforms for a conventional N-FET during the turn-on transition of a typical inverter mode operation.
Figure 3:
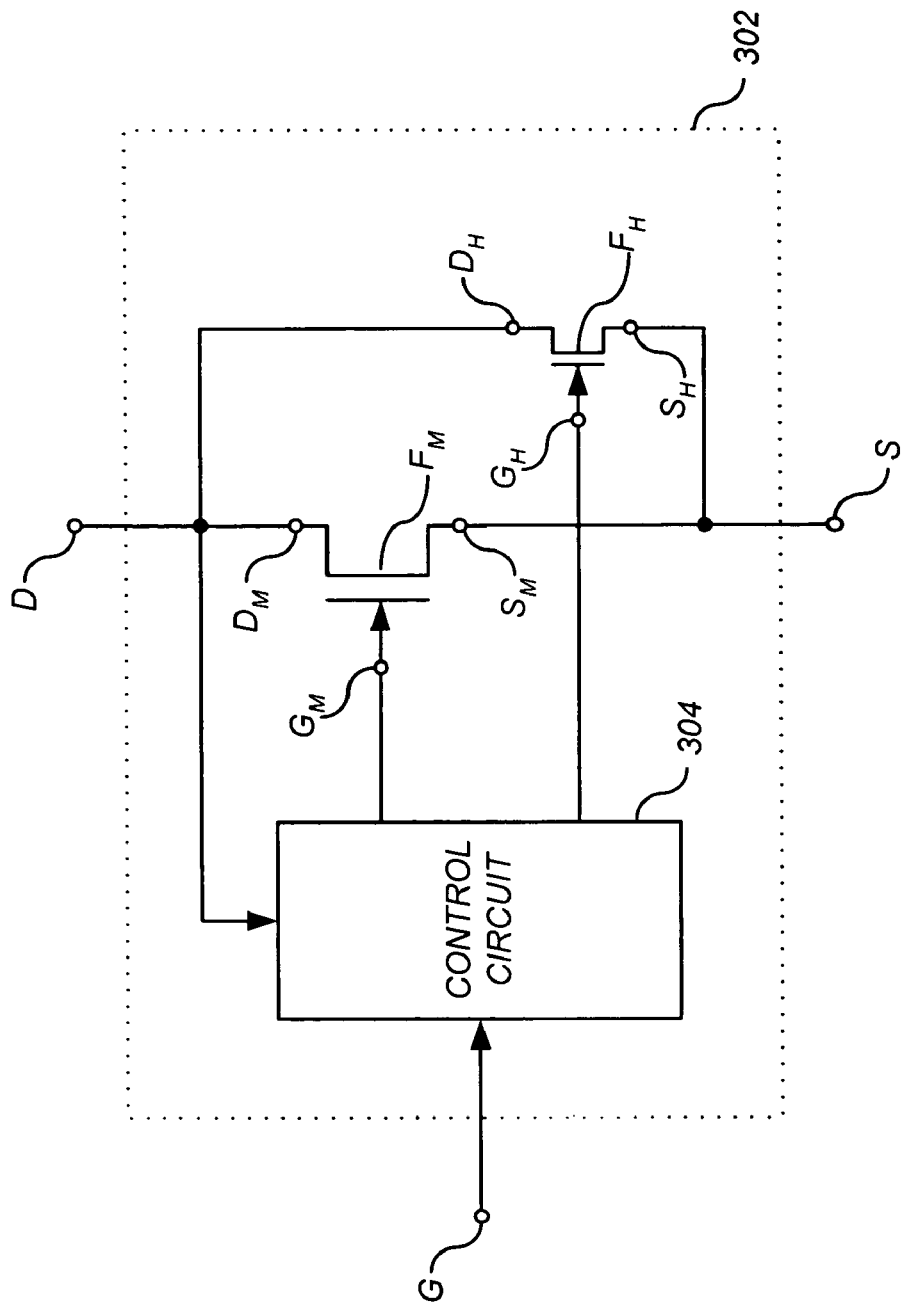
FIG. 3 is a block diagram of a FET switch according to one implementation.

FIG. 3 is a block diagram of a power FET switch 302 according to one implementation. FET switch 302 includes a main FET $F_M$, a helper FET $F_H$, and a control circuit 304. Control circuit 304 controls the timing of the operation of the main FET $F_M$ and the helper FET $F_H$. In one implementation, the main FET $F_M$ is designed for superior electrical performance, while the helper FET $F_H$ is designed for superior reliability performance. The helper FET $F_H$ can control the drain voltage of the main FET $F_M$ during the switching transition of the main FET $F_M$.

The drain $D_M$ of the main FET $F_M$ is coupled to the drain $D_H$ of the helper FET $F_H$ to form the drain D of FET switch 302. The source $S_M$ of the main FET $F_M$ is coupled to the source $S_H$ of the helper FET $F_H$ to form the source S of FET switch 302. Control circuit 304 receives control signals applied to the gate G of FET switch 302. In some implementations, control circuit 304 also receives control signals applied to the drain D of FET switch 302.

In one implementation, control circuit 304 controls the timing of the gate signal applied to terminal $G_M$ of the main FET $F_M$, and the gate signal applied to terminal $G_H$ of the helper FET $F_H$ such that the main FET $F_M$ operates at a stress-free biasing condition under any switching scenario.

Figure 4:
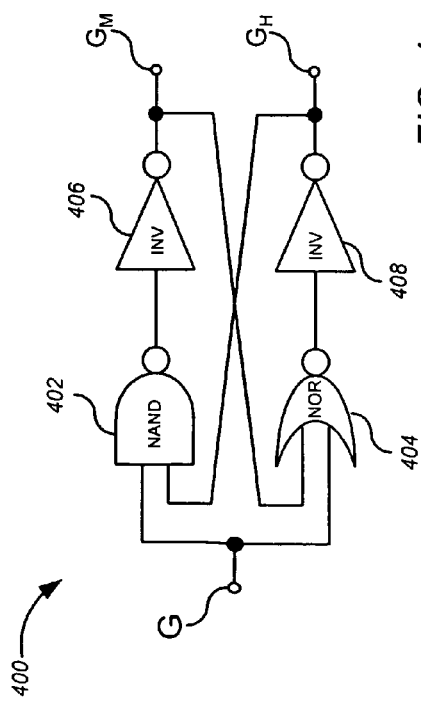
FIG. 4 depicts a circuit for use in an FET control circuit according to one implementation.

FIG. 4 depicts a circuit 400 for use in control circuit 304 according to one implementation. The inputs of a NAND gate 402 are coupled to terminals G and $G_H$. The inputs of a NOR gate 404 are coupled to terminals G and $G_M$. The output of NAND gate 402 is coupled to the input of an inverter 406. The output of inverter 406 is coupled to terminal $G_M$. The output of NOR gate 404 is coupled to the input of an inverter 408. The output of inverter 408 is coupled to terminal $G_H$.

Figure 5:
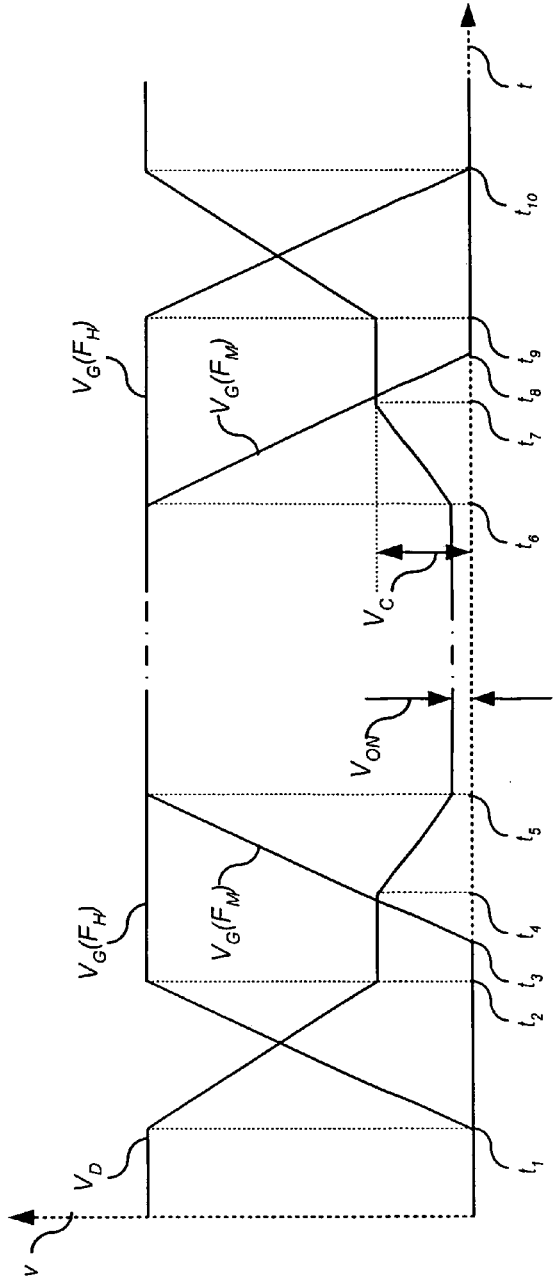
FIG. 5 shows a timing diagram for three of the voltage waveforms for a switch according to one implementation.

FIG. 5 shows a timing diagram for three of the voltage waveforms for FET switch 302 according to one implementation. $V_D$ is the voltage appearing at terminal D. $V_G(F_H)$ is the voltage applied to terminal $G_H$ by control circuit 304. $V_G(F_M)$ is the voltage applied to terminal $G_M$ by control circuit 304. $V_G$ is the voltage appearing at terminal G. $V_G$ is substantially similar to $V_G(F_H)$ during the turn-on transition, and is substantially similar to $V_G(F_M)$ during the turn-off transition. Therefore, for clarity, $V_G$ is not shown.

A turn-on transition is shown from time $t_1$ to time $t_5$. At $t_1$, $V_G$ begins to rise. FET switch 302 responds by turning on the helper FET $F_H$. Control circuit 304 turns on the helper FET $F_H$ by asserting a high voltage $V_G(F_H)$ at terminal $G_H$. Consequently, $V_G(F_H)$ begins to rise, and $V_D$ begins to drop.

At time $t_2$, the helper FET $F_H$ is on, so $V_G(F_H)$ is high and $V_D$ is clamped at a clamped voltage $V_C$.

At time $t_3$, FET switch 302 turns on the main FET $F_M$. The main FET $F_M$ can be turned on before the helper FET $F_H$ is completely on, as long as the drain voltage has dropped to a level at which HCI is no longer a concern. Control circuit 304 turns on the main FET $F_M$ by asserting a high voltage $V_G(F_M)$ at terminal $G_M$. At time $t_4$, $V_D$ begins to fall from $V_C$ to VON. At time $t_5$, the main FET $F_M$ is on, so $V_G(F_M)$ is high and $V_D$ has reached VON. As can be seen, control circuit 304 delays the main FET $F_M$ transition for a fixed delay time $T_{D1}=t_3-t_1$. Delay time $T_{D1}$ can be increased by adding buffer stages to control circuit 304.

A turn-off transition is shown from time $t_6$ to time $t_{10}$. At time $t_6$, $V_G$ begins to fall. FET switch 302 responds by turning off the main FET $F_M$. Control circuit 304 turns off the main FET $F_M$ by asserting a low voltage $V_G(F_M)$ at terminal $G_M$. Consequently, $V_G(F_M)$ begins to fall.

Depending on load conditions, $V_D$ may rise. In one implementation, the portion of the $V_D$ curve shown from time $t_6$ to time $t_{10}$ represents the maximum voltage $V_D$ is allowed to reach. FET switch 302 keeps $V_D$ at or below this maximum.

At time $t_7$, $V_D$ is restricted to at or below $V_C$. At time $t_8$, the main FET $F_M$ is off.

At time $t_9$, FET switch 302 turns off the helper FET $F_H$. The helper FET $F_H$ can be turned off before the main FET $F_M$ is completely off, as long as the drain voltage remains at a level at which HCI is no longer a concern. Control circuit 304 turns off the helper FET $F_H$ by asserting a low voltage $V_G(F_H)$ at terminal $G_H$. Consequently, $V_D$ is no longer clamped at or below $V_C$, and so $V_D$ may rise. At time $t_{10}$, the helper FET $F_H$ is off, so $V_G(F_H)$ is low and $V_D$ can be high. As can be seen, control circuit 304 delays the helper FET $F_H$ transition for a fixed delay time $T_{D2}=t_9-t_6$. Delay time $T_{D2}$ can be increased by adding buffer stages to control circuit 304.

As can be seen from FIG. 5, in the static state, the main FET $F_M$ and helper FET $F_H$ operate in parallel. However, their operations differ during the switching transient period. The helper FET $F_H$ turns on before the main FET $F_M$ turns on, thereby lowering the voltage across the main FET $F_M$ during its turn-on transition. The helper FET $F_H$ also turns off after the main FET $F_M$ turns off, thereby limiting the voltage across the main FET $F_M$ during its turn-off transition. Therefore, the main FET $F_M$ experiences no HCI stress.

In one implementation, the main FET $F_M$ is free of the reliability design constraint, and can be designed for optimal electrical performance. For example, the main FET $F_M$ can be designed using more aggressive design rules than a conventional FET not only to reduce the silicon area, but also to improve the efficiency of FET switch 302. In one implementation, the helper FET $F_H$ sustains all the HCI stress, and is designed for robust and reliable performance. The helper FET $F_H$ can be designed using conventional, or even more conservative, design rules to achieve this performance.

In one implementation, the magnitude of the benefits of FET switch 302 is a function of the relative size (or channel width) of the main FET $F_M$ and the helper FET $F_H$. Only the main FET $F_M$ portion contributes in terms of area saving and efficiency improvement. Thus, according to one implementation, the smaller the main FET $F_M$ is relative to the helper FET $F_H$, the greater the benefit.

In one implementation, the overall size of FET switch 302, including both the main FET $F_M$ and the helper FET $F_H$, is a function of an on-state voltage drop (VON) requirement.

In switching applications, VON typically is a very low voltage level. The helper FET $F_H$ alone is on to clamp the drain of the main FET $F_M$ at a voltage lower than the blocking voltage that FET switch 302 will otherwise see during conventional switching. Blocking voltage is the voltage that a switch sustains in the off-state. The relative size of the helper FET $F_H$ to the size of the helper FET $F_H$ and the main FET $F_M$ combined is inversely proportional to the ratio of clamped voltage ($V_C$) to VON.

Hot-carrier injection quickly subsides as clamped voltage $V_C$ decreases from the blocking voltage. Therefore, clamped voltage $V_C$ can be much higher than zero while still being low enough to protect the main FET $F_M$ from hot-carrier stress. In one implementation, clamped voltage $V_C$ in FET switch 302 has a much greater voltage range than conventional switching modes.

Figure 6:
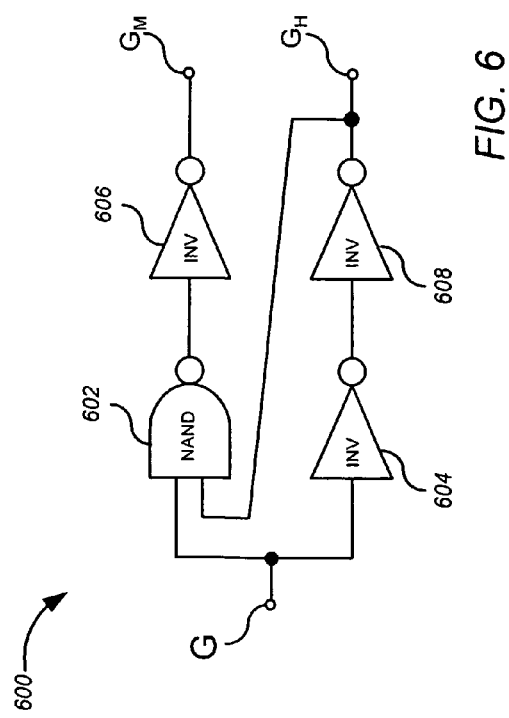
FIG. 6 depicts a circuit for use in an FET control circuit according to another implementation.

FIG. 6 depicts a circuit 600 for use in control circuit 304 according to another implementation. The inputs of a NAND gate 602 are coupled to terminals G and $G_H$. The input of an inverter 604 is coupled to terminal G. The input of an inverter 606 is coupled to the output of NAND gate 602. The output of inverter 606 is coupled to terminal $G_M$. The output of inverter 604 is coupled to the input of an inverter 608. The output of inverter 608 is coupled to terminal $G_H$. As can be seen, circuit 600 delays the main FET $F_M$ transition for a fixed delay time $T_{D1}=t_3-t_1$. Circuit 600 implements the timing of FIG. 5 only for the turn-on transition of FET switch 302.

Figure 7:
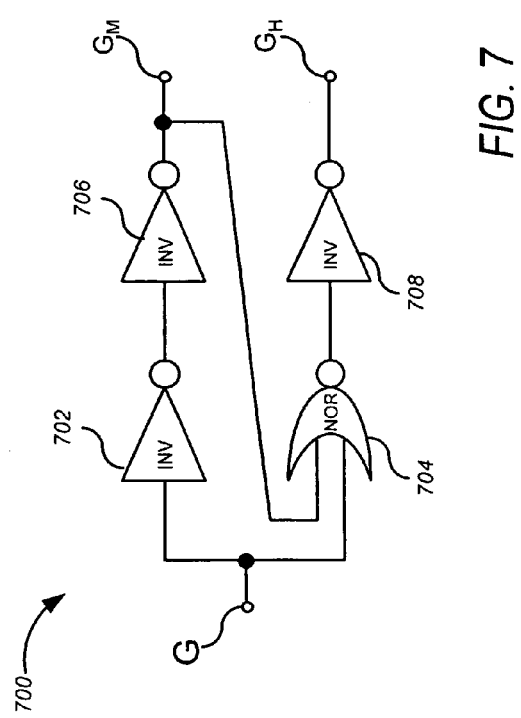
FIG. 7 depicts a circuit for use in an FET control circuit according to still another implementation.

FIG. 7 depicts a circuit 700 for use in control circuit 304 according to still another implementation. The input of an inverter 702 is coupled to terminal G. The inputs of a NOR gate 704 are coupled to terminals G and $G_M$. The input of an inverter 706 is coupled to the output of inverter 702. The output of inverter 706 is coupled to terminal $G_M$. The output of NOR gate 704 is coupled to the input of an inverter 708. The output of inverter 708 is coupled to terminal $G_H$. Circuit 700 implements the timing of FIG. 5 only for the turn-off transition of FET switch 302.

Figure 8:
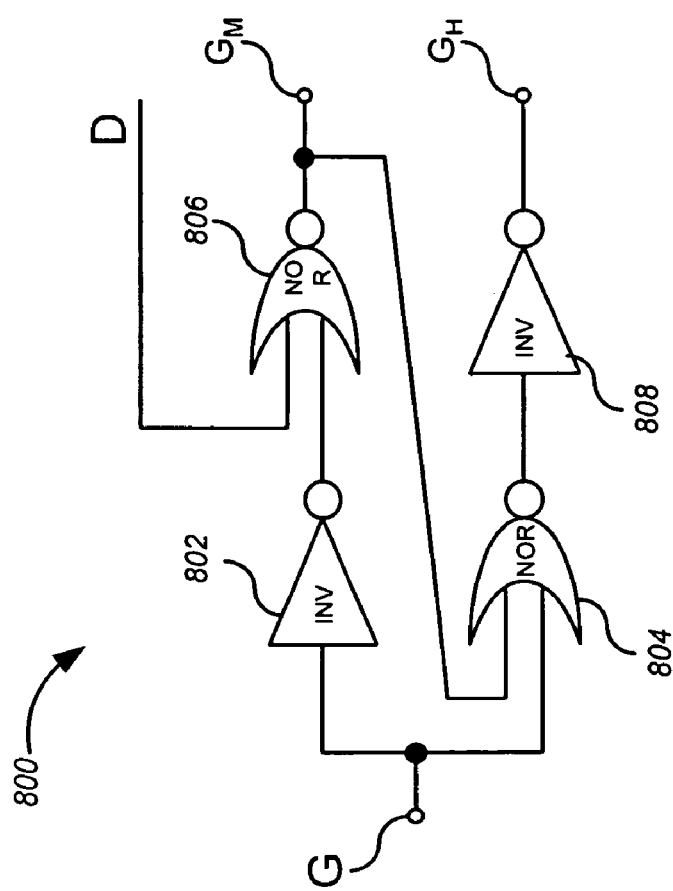
FIG. 8 depicts a circuit for use in an FET control circuit according to yet another implementation.

FIG. 8 depicts a circuit 800 for use in control circuit 304 according to yet another implementation. The input of an inverter 802 is coupled to terminal G. The inputs of a NOR gate 804 are coupled to terminals G and $G_M$. The inputs of a NOR gate 806 are coupled to terminal D and the output of inverter 802. The input of an inverter 808 is coupled to the output of NOR gate 804. The output of inverter 808 is coupled to terminal $G_H$. Circuit 800 implements the timing of FIG. 5 only for the turn-on transition of FET switch 302.

Circuit 800 implements a variable delay $T_{DV}=t_3-t_1$ during the turn-on transition of FET switch 302, when the effects of HCI are more severe than during the turn-off transition. The turn-on of the main FET $F_M$ is delayed until the drain voltage $V_D$ falls below a predetermined voltage. In this implementation, clamped voltage $V_C$ is designed to be within the range of an effective logic "low." Circuit 800 implements a fixed delay $T_{D2}=t_9-t_6$ during the turn-off transition of FET switch 302.

In one implementation control circuit 304 includes a current sensing circuit. When the load current falls below a predetermined threshold, control circuit 304 shuts off main FET $F_M$. Switching is then accomplished by helper FET $F_H$ alone.

For a given size for FET switch 302, the conduction loss of FET switch 302 decreases with decreases in DC load current. When FET switch 302 is operated at a light load current condition, the power losses incurred by charging up the gate capacitance of FET switch 302 (including both the main FET $F_M$ and the helper FET $F_H$) may dominate the overall loss of FET switch 302. Therefore, the conduction loss of FET switch 302 becomes negligible, and the overall efficiency of FET switch 302 improves due to the dramatic reduction of gate capacitance and charging loss associated with the gate capacitance. In this situation, it is useful to disable the main FET $F_M$ and use the helper FET $F_H$ only.

Figure 9:
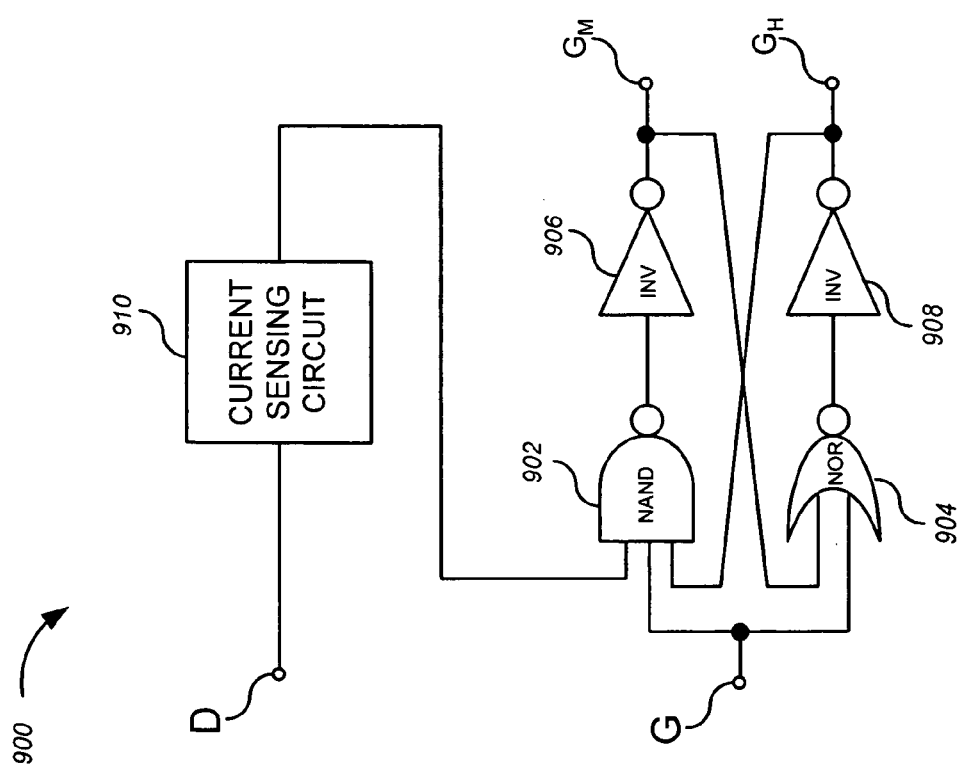
FIG. 9 depicts a circuit for use in an FET control circuit according to another implementation.

FIG. 9 depicts a circuit 900 for use in control circuit 304 according to this implementation. The inputs of a NAND gate 902 are coupled to terminals G and $G_H$, and to the output of a current sensing circuit 910. The inputs of a NOR gate 904 are coupled to terminals G and $G_M$. The output of NAND gate 902 is coupled to the input of an inverter 906. The output of inverter 906 is coupled to terminal $G_M$. The output of NOR gate 904 is coupled to the input of an inverter 908. The output of inverter 908 is coupled to terminal $G_H$.

Current sensing circuit 910 outputs a logic high level when the drain current (that is, the current at drain D) is greater than a predetermined threshold current (indicating a normal load). Current sensing circuit 910 outputs a logic low level when the drain current is less than the predetermined threshold current (indicating a light load). Such current sensing circuits are well-known in the relevant arts. Circuit 900 thus operates in a manner similar to circuit 400 in FIG. 4 under normal loads. However, under light loads, circuit 900 keeps the main FET $F_M$ shut off at all times, while the helper FET $F_H$ is free to carry out the function of FET switch 302.

Safe Operating Area

In addition to improving efficiency improvement and reliability enhancement in terms of HCI, implementations and techniques (including timing requirements) described above are also useful for improving other aspects of a power switch, for example, to widen the safe operating area (SOA) of a power switch. HCI and SOA concerns are generally related to the same MOSFET device characteristic—i.e., the generation of substrate impact ionization current when the MOSFET device is subjected to stress under both high voltage and high current.

Figure 10:
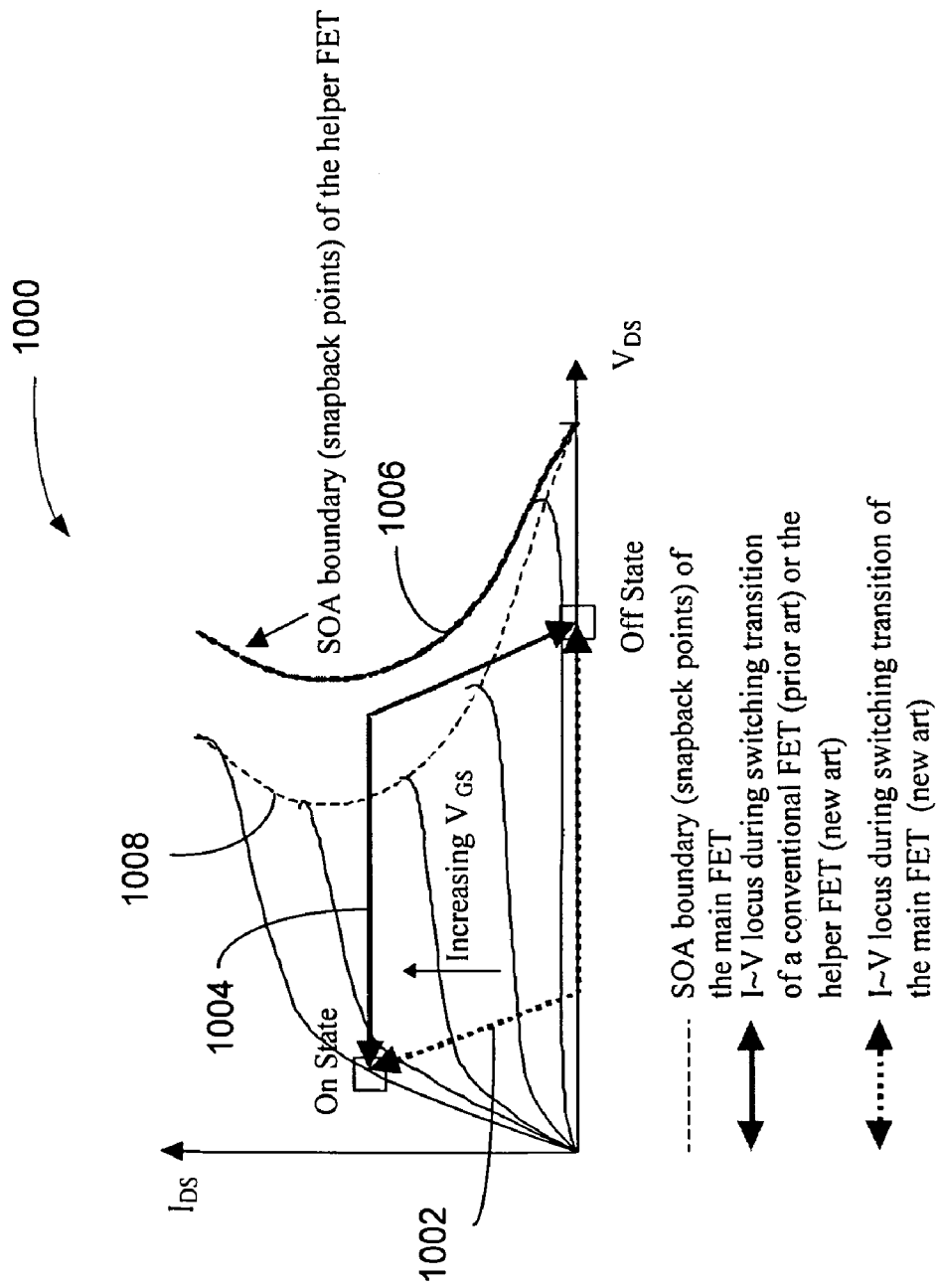
FIG. 10 is a graph illustrating current-voltage trajectories during switching transition of a FET switch according to one implementation.

FIG. 10 shows a graph 1000 illustrating current-voltage (I-V) trajectories 1002, 1004, of a main FET $F_M$ and a helper FET $F_H$, respectively, during switching transitions according to one implementation. In this implementation, the helper FET $F_H$ is designed to achieve a wider SOA boundary 1006 relative to an SOA boundary 1008 of the main FET $F_M$. Thus, the main FET $F_M$ can be designed having a superior electrical performance (such as having a low on-resistance) relative to the helper FET $F_H$.

By timing turn-on and turn-off sequences between the main FET $F_M$ and the helper FET $F_H$, the helper FET $F_H$ can control the I-V trajectory (or locus) 1002 of the main FET $F_M$ so that the main FET $F_M$ turns on and off according to zero-voltage switching (ZVS), as shown in FIG. 10. ZVS is less demanding on the SOA of the device. By relieving the SOA constraints of the main FET $F_M$, the main FET $F_M$ can, therefore, be optimized to have a better electrical performance than the helper FET $F_H$.

Avalanche Energy Capability

In one implementation, FET switch 302 includes a main FET $F_M$ designed for superior electrical performance, and a helper FET $F_H$ designed with a higher ruggedness (or avalanche energy rating). Device ruggedness can be defined by the capacity of a device to sustain an avalanche current during an unclamped inductive load switching event. The helper FET $F_H$ can be designed with a higher avalanche energy rating, but with a lower avalanche breakdown voltage (BV) relative to the main FET $F_M$. In such an implementation, only the helper FET $F_H$ will reach an avalanche breakdown state during a switching transient. The helper FET can protect the main FET by clamping a voltage spike (associated with avalanche breakdown), and the high avalanche energy rating of the helper FET can ensure ruggedness of FET switch 302.

With respect to timing between gate signals of the main FET $F_M$ and the helper FET $F_H$, there can be no specific timing requirement. For example, both the main FET $F_M$ and the helper FET $F_H$ can be driven simultaneously, or according to timing requirements as discussed above in connection with HCI degradation and SOA.

LDMOS Transistor

As discussed above, implementations can include other types of MOSFET devices. One example of another type of MOSFET device is a lateral double diffused MOSFET (LDMOS) transistor.

Figure 11:
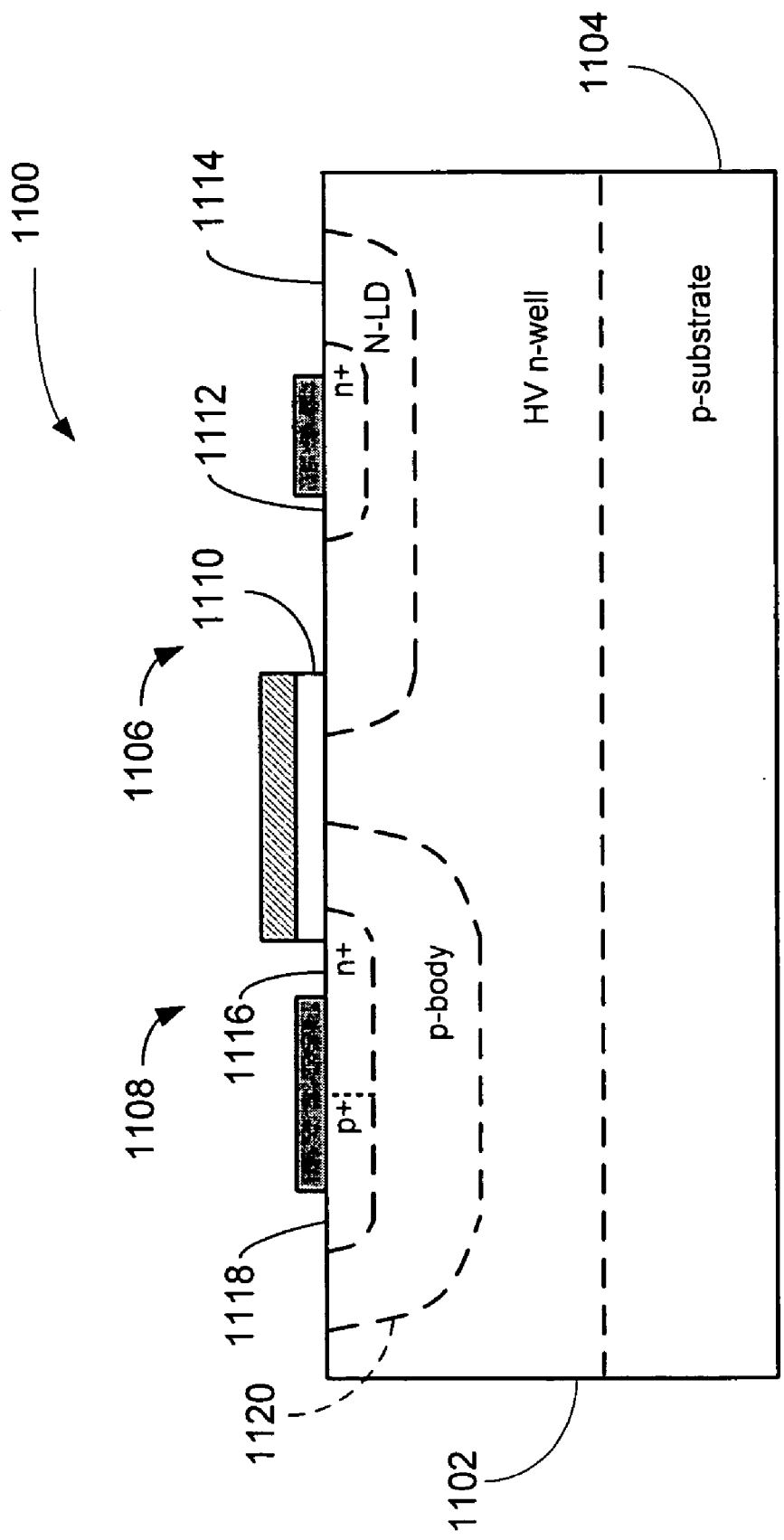
FIG. 11 shows a cross-sectional view of a lateral double diffused MOSFET (LDMOS) transistor.

FIG. 11 shows a cross-sectional view of an LDMOS transistor 1100. LDMOS transistor 1100 can be fabricated on a high voltage n-type well (HV n-well) 1102 implanted in a p-type substrate 1104. An HV n-well is typically used for high voltage LDMOS transistors—e.g., greater than 30V. HV n-well 1102 can have a retrograded vertical doping profile. LDMOS transistor 1100 includes a drain region 1106, a source region 1108, and a gate 1110. Drain region 1106 includes an n-doped n+ region 1112 and an n-doped shallow drain (N-LD) 1114. Source region 1108 includes an n-doped n+ region 1116, a p-doped p+ region 1118, and a p-doped P-body 1120.

Referring to FIG. 3, in one implementation, FET switch 302 includes a main FET $F_M$ implemented using a CMOS N-FET and a helper FET $F_H$ implemented using a more robust LDMOS transistor. An LDMOS transistor is intrinsically more robust than a CMOS N-FET due to LDMOS transistors having a deeper drain characteristic with respect to CMOS N-FETs. In this implementation, the LDMOS transistor can have larger or smaller dimensions of $L_G$ and $L_D$ relative to the CMOS N-FET, even though the CMOS N-FET is designed having superior electrical performance.

In one implementation, FET switch 302 includes a main FET $F_M$ and a helper FET $F_H$ each implemented using a LDMOS transistor. The main FET $F_M$ can have smaller dimensions of one or all of $L_G$, $L_D$, and a channel length relative to the helper FET $F_H$. The main FET $F_M$ can have a shallow or lightly doped p-body implant (to lower a threshold voltage of the main FET $F_M$ for a low on-resistance), and the helper FET $F_H$ can have a deep or heavily doped p-body implant for better ruggedness. Alternatively, other implants of one LDMOS can have a different doping and/or size relative to the other LDMOS transistor to achieve different operating characteristics.

Implementations can be implemented in digital electronic circuitry, or in computer hardware, firmware, software, or in combinations of them. Apparatus can be implemented in a computer program product tangibly embodied in a machine-readable storage device for execution by a programmable processor; and method steps can be performed by a programmable processor executing a program of instructions to perform functions described above by operating on input data and generating output.

Implementations can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, it will be understood that various modifications may be made. For example, FET switch 302 can be implemented monolithically, or as two or more discrete components. The main FET $F_M$, the helper FET $F_H$, or both can be implemented as a single FET or as many FETs operating together. FET switch 302 can be implemented using N-type MOSFETs or P-type MOSFETs. FET switch 302 can be implemented to affect only the turn-on transition, only the turn-off transition, or both. FET switch 302 can be implemented to drive capacitive, resistive or inductive loads. In addition, the length of a drain $L_D$ can be measured from a gate of a FET to any implant region within the drain of the FET, and can also vary depending upon conventions of a particular FET. Accordingly, other implementations are within the scope of the following claims.

What is claimed is:

1. A power switch having source, drain and gate terminals, the power switch comprising:
   a first field-effect transistor (FET) having a first drain coupled to the drain terminal, a first source coupled to the source terminal, and a first gate;
   a second FET having a second drain coupled to the drain terminal, a second source coupled to the source terminal, and a second gate, the second FET having a gate length ($L_G$) that is greater than or less than an $L_G$ of the first FET and having a length of a drain ($L_D$) that is greater than or less than an $L_D$ of the first FET; and
   a control circuit coupled to the gate terminal, and having a first control signal coupled to the first gate and a second control signal coupled to the second gate, the first control signal and the second control signal being separate control signals, and the first control signal having a rising edge with a different timing than a rising edge of the second control signal.

2. The power switch of claim 1, wherein the control circuit is configured to turn on the second FET before turning on the first FET.

3. The power switch of claim 1, wherein the control circuit is coupled to the drain terminal.

4. The power switch of claim 3, wherein the control circuit is configured to impose a fixed delay between turning on the first and second FETs.

5. The power switch of claim 4, wherein the control circuit is configured to delay turning on the first FET until the voltage between the drain and source terminals falls below a predetermined voltage.

6. The power switch of claim 1, wherein the control circuit is configured to turn off the second FET after turning off the first FET.

7. The power switch of claim 6, wherein the control circuit is configured to impose a fixed delay between turning off the first and second FETs.

8. The power switch of claim 1, wherein the first FET is designed for electrical performance superior to that of the second FET.

9. The power switch of claim 8, wherein the first FET is an n-type CMOS FET.

10. The power switch of claim 8, wherein the first FET is an LDMOS transistor.

11. The power switch of claim 1, wherein the second FET is designed for reliability performance superior to that of the first FET.

12. The power switch of claim 1, wherein the first and second FETs are implemented as a single monolithic device.

13. The power switch of claim 1, wherein the first and second FETs and the control circuit are implemented as a single monolithic device.

14. The power switch of claim 1, wherein the second FET has an $L_G$ greater than an $L_G$ of the first FET and an $L_D$ greater than an $L_D$ of the first FET.

15. The power switch of claim 1, further comprising:
   a current sensing circuit configured to disable the first FET when the load current at the drain terminal is below a predetermined threshold current.

16. The power switch of claim 15, wherein the current sensing circuit is configured to switch the second FET when the first FET is disabled.

17. The power switch of claim 1, wherein the first FET has an area less than the area of the second FET.

18. The power switch of claim 1, wherein the second FET has an $L_G$ smaller than an $L_G$ of the first FET and an $L_D$ smaller than an $L_D$ of the first FET.

19. The power switch of claim 1, wherein $L_D$ is a measurement that represents spacing between an N+ drain implant and a gate of a given FET.

20. The power switch of claim 1, wherein the second FET is more resilient to hot-carrier degradation than the first FET.

21. The power switch of claim 1, wherein the second FET has a wider safe operating area (SOA) than the first FET.

22. The power switch of claim 1, wherein the second FET has a higher avalanche energy rating than the first FET.

23. The power switch of claim 1, wherein the control circuit includes one or more buffer stages for delaying the timing of the rising edge of the first control signal relative to the timing of the rising edge of the second control signal.

24. A method of operating a power switch having a source terminal and a drain terminal, comprising:
   turning on a first field-effect transistor (FET) using a first control signal having a first rising edge, the first FET having a first drain coupled to the drain terminal, a first source coupled to the source terminal, and a first gate;
   turning on a second FET using a second control signal having a second rising edge while the first FET is on, the second control signal being separate from the first control signal, the second rising edge having a different timing than first rising edge, the second FET having a second drain coupled to the drain terminal, a second source coupled to the source terminal, and a second gate, the second FET having a gate length ($L_G$) that is greater than or less than an $L_G$ of the first FET and having a length of a drain ($L_D$) that is greater than or less than an $L_D$ of the first FET;

turning off the second FET using the second control signal while the first FET is on; and turning off the first FET using the first control signal.

25. The method of claim 24, wherein the turning on and off the second FET and first FET includes directing signals from a control circuit to the first and second gates.

26. The method of claim 25, further comprising receiving a signal in the control circuit from the drain terminal.

27. The method of claim 24, further comprising delaying turning on the second FET for a predetermined period of time after turning on the first FET.

28. The method of claim 24, further comprising determining a voltage between the drain and source terminals.

29. The method of claim 28, further comprising delaying turning on the second FET until the voltage between the drain and source terminals falls below a predetermined voltage.

30. The method of claim 24, further comprising delaying turning off the first FET for a predetermined period of time after turning off the second FET.

31. The method of claim 24, further comprising determining a load current at the drain terminal.

32. The method of claim 31, further comprising disabling the second FET when the load current at the drain terminal is below a predetermined threshold current.

33. The method of claim 21, further comprising switching the first FET when the second FET is disabled.

34. The method of claim 24, wherein the second FET is designed for electrical performance superior to that of the first FET.

35. The method of claim 24, wherein the helper FET is designed for reliability performance superior to that of the main FET.

36. The method of claim 24, wherein the first FET and the second FET are implemented as a single monolithic device.

37. The method of claim 24, wherein the first FET has an area less than the area of the second FET.

38. The method of claim 24, wherein $L_D$ is a measurement that represents spacing between an N+ drain implant and a gate of a given FET.

39. The method of claim 24, wherein the second FET is an n-type CMOS FET.

40. The method of claim 24, wherein the second FET is an LDMOS transistor.

41. The method of claim 24, further comprising using one or more buffer stages to delay the timing of the rising edge of the second control signal relative to the timing of the rising edge of the first control signal.

* * * * *

UNITED STATES PATENT AND TRADEMARK OFFICE
CERTIFICATE OF CORRECTION

| | | |
|---|---|---|
| PATENT NO. | : 6,937,086 B1 | Page 1 of 1 |
| APPLICATION NO. | : 10/796405 | |
| DATED | : August 30, 2005 | |
| INVENTOR(S) | : Budong You and Marco A. Zuniga | |

It is certified that error appears in the above-identified patent and that said Letters Patent is hereby corrected as shown below:

Column 12, line 1), change "21" to --32--.

Signed and Sealed this

Twenty-second Day of May, 2007

JON W. DUDAS
*Director of the United States Patent and Trademark Office*